United States Patent
Wada et al.

(10) Patent No.: US 9,224,816 B2
(45) Date of Patent: Dec. 29, 2015

(54) SILICON CARBIDE SEMICONDUCTOR DEVICE

(71) Applicant: Sumitomo Electric Industries, Ltd., Osaka-shi (JP)

(72) Inventors: Keiji Wada, Osaka (JP); Toru Hiyoshi, Osaka (JP); Masaki Furumai, Osaka (JP); Mitsuhiko Sakai, Osaka (JP); Kosuke Uchida, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/692,458

(22) Filed: Apr. 21, 2015

(65) Prior Publication Data

US 2015/0340443 A1    Nov. 26, 2015

(30) Foreign Application Priority Data

May 21, 2014    (JP) ................................. 2014-105489
May 21, 2014    (JP) ................................. 2014-105490

(51) Int. Cl.
*H01L 31/0312*    (2006.01)
*H01L 29/16*    (2006.01)
*H01L 29/06*    (2006.01)
*H01L 29/36*    (2006.01)

(52) U.S. Cl.
CPC ........ *H01L 29/1608* (2013.01); *H01L 29/0646* (2013.01); *H01L 29/0688* (2013.01); *H01L 29/36* (2013.01)

(58) Field of Classification Search
None
See application file for complete search history.

(56) References Cited

U.S. PATENT DOCUMENTS

| 2003/0067033 | A1 | 4/2003 | Kinoshita et al. | |
|---|---|---|---|---|
| 2004/0173820 | A1 | 9/2004 | Kinoshita et al. | |
| 2008/0258152 | A1 | 10/2008 | Yamamoto et al. | |
| 2014/0197422 | A1* | 7/2014 | Wada et al. | 257/77 |
| 2015/0214353 | A1* | 7/2015 | Yamada et al. | 257/77 |

FOREIGN PATENT DOCUMENTS

| JP | 2003-101039 A | 4/2003 |
|---|---|---|
| JP | 2008-270412 A | 11/2008 |

OTHER PUBLICATIONS

Niwa et al., "21.7 kV 4H-SiC PiN Diode with a Space-Modulated Junction Termination Extension," The Japan Society of Applied Physics, Applied Physics Express 5 (2012) 64001, pp. 64001-1-64001-3.

(Continued)

*Primary Examiner* — Jack Chen
(74) *Attorney, Agent, or Firm* — Venable LLP; Michael A. Sartori

(57) ABSTRACT

A silicon carbide semiconductor device includes a silicon carbide layer, an element region including a semiconductor element portion formed in the silicon carbide layer, a JTE region (first electric field relaxing region), an insulating film disposed on a first main surface and covering the JTE region, and a pad electrode electrically connected to the JTE region. The pad electrode includes an extension portion extending from an end of the JTE region close to the element region in a peripheral direction from the element region toward the JTE region, the extension portion being disposed on the insulating film. The extension portion overlies at least a portion of the JTE region.

15 Claims, 9 Drawing Sheets

(56) References Cited

OTHER PUBLICATIONS

Niwa et al., "Breakdown Characteristics of 12-20 kV-class 4H-SiC PiN Diodes with Improved Junction Termination Structures," Proceedings of the 2012 24th International Symposium on Power Semiconductor Devices and ICs, Jun. 3-7, 2012, Bruges, Belgium, pp. 381-384.

Matsunami et al., "Semiconductor SiC Technology and Application," second edition, Nikkan Kogyo Shinbun, Ltd., Sep. 30, 2011, p. 341 and p. 353.

* cited by examiner

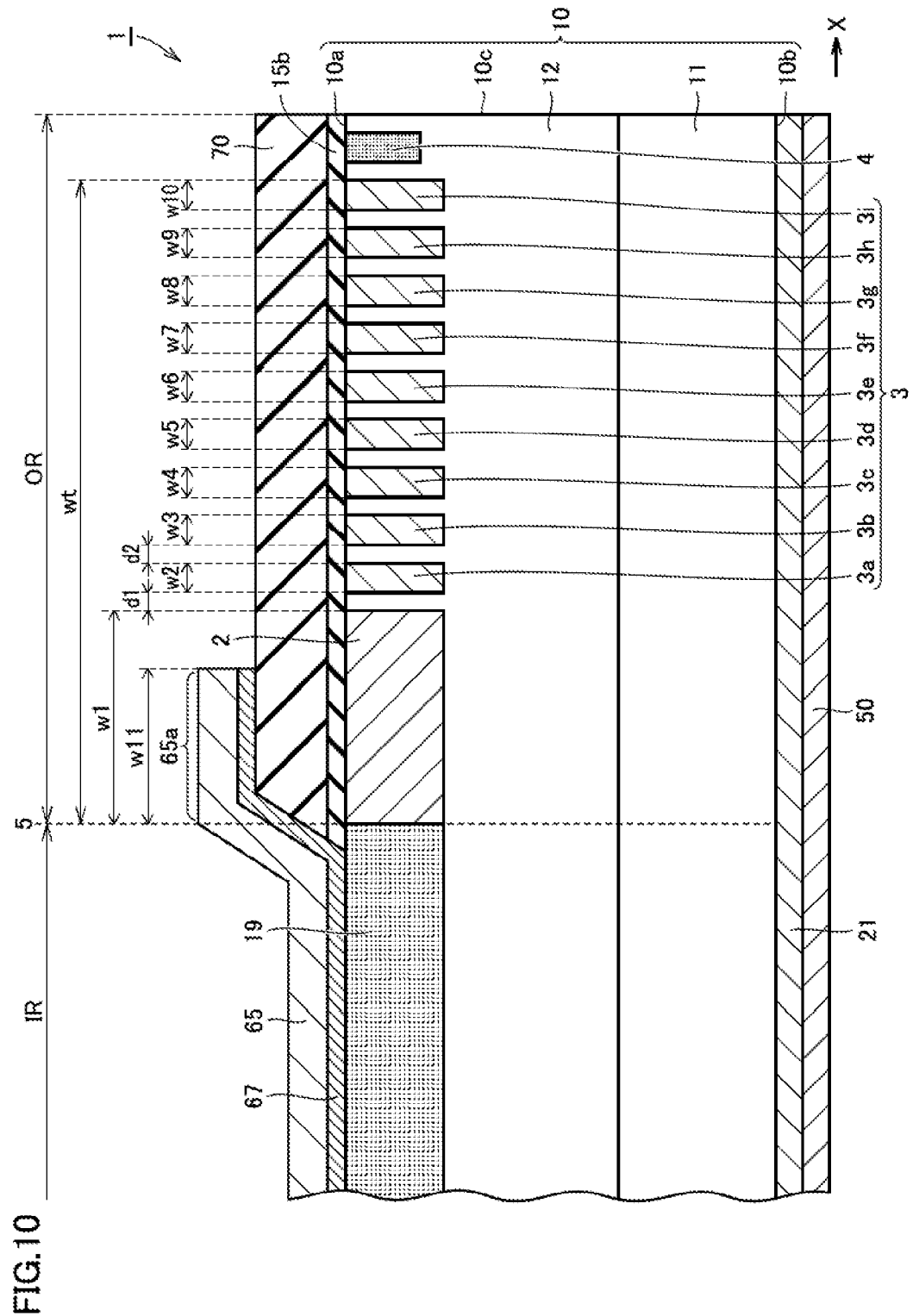

SILICON CARBIDE SEMICONDUCTOR DEVICE

BACKGROUND OF THE INVENTION

1. Field of the Invention

The present invention relates to silicon carbide semiconductor devices.

2. Description of the Background Art

Conventionally, silicon has been widely used as a material for a semiconductor device. In recent years, silicon carbide has been increasingly employed as a material for a semiconductor device.

Silicon carbide is a wide band gap semiconductor having a band gap wider than that of silicon. By employing the silicon carbide as a material for a semiconductor device, a higher breakdown voltage and loss reduction of the semiconductor device can be achieved, and the semiconductor device can be used in a high-temperature environment.

In order to achieve a higher breakdown voltage of a semiconductor device, studies have been conducted on the structure of a semiconductor device in addition to the material of a semiconductor device. By way of example, a study has been conducted on an outer peripheral structure (also referred to as a termination structure) surrounding the outer periphery of an element region in a silicon carbide semiconductor device. When a high voltage is applied to a silicon carbide semiconductor device, the outer peripheral structure performs the function of relaxing electric field concentration. The relaxed electric field concentration can lead to a higher breakdown voltage of the silicon carbide semiconductor device.

Various proposals on the outer peripheral structure of a silicon carbide semiconductor device have been described in documents. Examples of the documents include Japanese Patent Laying-Open No. 2003-101039, Japanese Patent Laying-Open No. 2008-270412, Hiroyuki Matsunami, Noboru Otani, Tsunenobu Kimoto, and Takashi Nakamura, "Semiconductor SiC Technology and Application," second edition, Nikkan Kogyo Shimbun, Ltd., Sep. 30, 2011, p. 341 and p. 353, and Hiroki Niwa, Gan Feng. Jun Suda, and Tsunenobu Kimoto. "Breakdown Characteristics of 12-20 kV-class 4H-SiC PiN Diodes with Improved Junction Termination Structures," Proceedings of the 2012 24th International Symposium on Power Semiconductor Devices and ICs, 3-7 Jun. 2012, Bruges, Belgium, p381-384, and Hiroki Niwa, Jun Suda, and Tsunenobu Kimoto, "21.7 kV 4H-SiC PiN Diode with a Space-Modulated Junction Termination Extension," The Japan Society of Applied Physics, Applied Physics Express 5 (2012) 64001, 64001-1-64001-3.

SUMMARY OF THE INVENTION

A silicon carbide semiconductor device according to one embodiment of the present invention includes a silicon carbide layer including a first main surface and a second main surface located opposite the first main surface, the silicon carbide layer having a first conductivity type, an element region including a semiconductor element portion formed in the silicon carbide layer, a first electric field relaxing region having a second conductivity type different from the first conductivity type, the first electric field relaxing region being disposed in the silicon carbide layer so as to be in contact with the first main surface of the silicon carbide layer and so as to surround the element region when viewed two-dimensionally, an insulating film disposed on the first main surface and covering the first electric field relaxing region, and an electrode electrically connected to the first electric field relaxing region. The electrode includes an extension portion extending from an end of the first electric field relaxing region close to the element region in a peripheral direction from the element region toward the first electric field relaxing region, the extension portion being disposed on the insulating film. The extension portion overlies at least a portion of the first electric field relaxing region.

The objects, features, aspects and advantages of the present invention will become more apparent from the following detailed description of the present invention when taken in conjunction with the accompanying drawings.

BRIEF DESCRIPTION OF THE DRAWINGS

FIG. 10 is a schematic sectional view schematically showing a silicon carbide semiconductor device according to a sixth embodiment of the present invention.

DETAILED DESCRIPTION OF THE INVENTION

Figure 1:
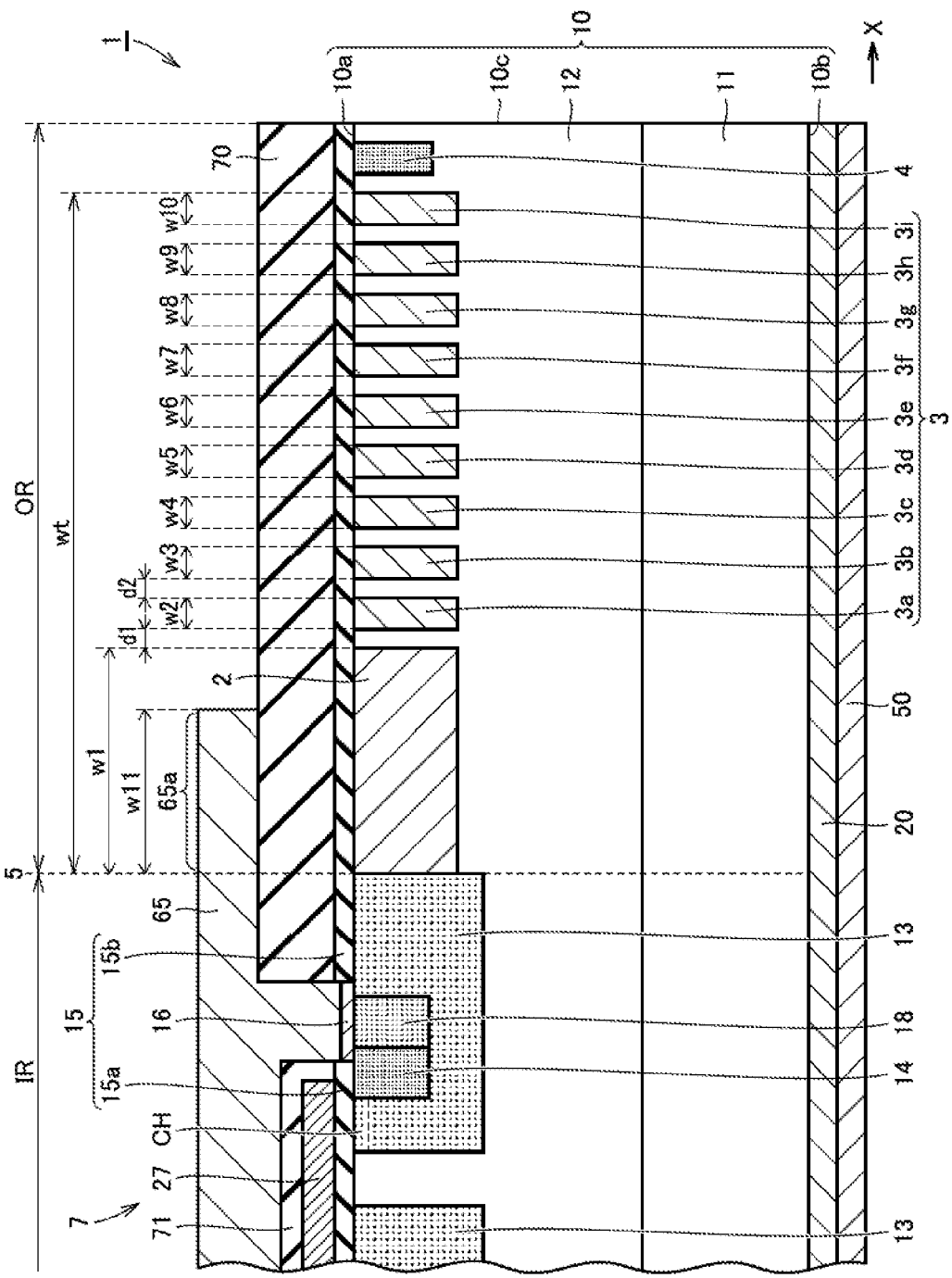
FIG. 1 is a schematic sectional view schematically showing the structure of a silicon carbide semiconductor device according to a first embodiment of the present invention.

The documents cited above describe the effect of the internal structure of the silicon carbide semiconductor device or the concentration in the impurity region on the breakdown voltage of the silicon carbide semiconductor device. However, these documents fail to describe the effect of an electrode disposed on a surface of a silicon carbide semiconductor substrate or above the silicon carbide semiconductor substrate on the breakdown voltage of the silicon carbide semiconductor substrate. A potential supplied to the electrode may affect an electric field generated in the silicon carbide semiconductor device. In order to increase the breakdown voltage of the silicon carbide semiconductor device, therefore, not only the structure of a termination region (electric field relaxing region) but also the structure of an electrode disposed in the vicinity of the termination region is studied.

DESCRIPTION OF EMBODIMENTS OF THE INVENTION

First, embodiments of the present invention will be described in list form. As used herein, the term "electrically connected" is not limited to electrical conduction that occurs between two elements directly connected to each other, but includes electrical conduction that occurs between two elements with another element interposed therebetween.

(1) A silicon carbide semiconductor device according to one embodiment of the present invention includes a silicon carbide layer (10) including a first main surface (10a) and a second main surface (10b) located opposite the first main surface (10a), the silicon carbide layer having a first conductivity type, an element region (IR) including a semiconductor element portion (7) formed in the silicon carbide layer (10), a first electric field relaxing region (2) having a second conductivity type different from the first conductivity type, the first electric field relaxing region being disposed in the silicon carbide layer (10) so as to be in contact with the first main surface (10a) of the silicon carbide layer (10) and so as to surround the element region (IR) when viewed two-dimensionally, an insulating film (15b, 70) disposed on the first main surface (10a) and covering the first electric field relaxing region (2), and an electrode (65) electrically connected to the first electric field relaxing region (2). The electrode (65) includes an extension portion (65a) extending from an end (5) of the first electric field relaxing region (2) close to the element region (IR) in a peripheral direction (X) from the element region (IR) toward the first electric field relaxing region (2), the extension portion being disposed on the insulating film (15b, 70). The extension portion (65a) overlies at least a portion of the first electric field relaxing region (2).

According to the configuration described above, a silicon carbide semiconductor device having an electrode structure suitable for increasing a breakdown voltage can be provided. The electrode includes the extension portion extending from the end of the first electric field relaxing region close to the element region in the peripheral direction from the element region toward the first electric field relaxing region. The extension portion overlies at least a portion of the first electric field relaxing region with the insulating film interposed therebetween. Consequently, the effect of relaxing the electric field concentration by the first electric field relaxing region is further enhanced. The breakdown voltage of the silicon carbide semiconductor device can thus be increased. The term "viewed two-dimensionally" means a view seen from the first main surface of the silicon carbide layer.

(2) Preferably, the silicon carbide semiconductor device further includes a second electric field relaxing region (3). The second electric field relaxing region (3) is disposed in the silicon carbide layer (10) so as to surround the first electric field relaxing region (2) when viewed two-dimensionally, the second electric field relaxing region having the second conductivity type.

According to the configuration described above, the electric field concentration in the silicon carbide semiconductor device can be relaxed by the first electric field relaxing region as well as the second electric field relaxing region. The breakdown voltage of the silicon carbide semiconductor device can thus be further increased.

(3) Preferably, the insulating film (15b, 70) is disposed on the first main surface (10a) of the silicon carbide layer (10) so as to cover the first electric field relaxing region (2) and the second electric field relaxing region (3). The extension portion (65a) of the electrode (65) extends from the end (5) of the first electric field relaxing region (2) so as to overlie the first electric field relaxing region (2) and at least a portion of the second electric field relaxing region (3).

According to the configuration described above, the effect of relaxing the electric field concentration by the first electric field relaxing region and the second electric field relaxing region can be enhanced. The breakdown voltage of the silicon carbide semiconductor device can thus be increased.

(4) Preferably, a width (w11) of the extension portion from the end (5) of the first electric field relaxing region (2) along the peripheral direction (X) is not less than 5 μm.

According to the configuration described above, the effect of relaxing the electric field concentration can be enhanced in the first electric field relaxing region. The breakdown voltage of the silicon carbide semiconductor device can thus be increased.

(5) Preferably, the width (w11) of the extension portion (65a) from the end (5) of the first electric field relaxing region (2) along the peripheral direction (X) is not less than 9 μm.

According to the configuration described above, the electric field concentration can be relaxed in the first electric field relaxing region. Thus, a silicon carbide semiconductor device having improved ruggedness can be provided.

(6) Preferably, a width (w1) of the first electric field relaxing region (2) along the peripheral direction (X) is not less than 5 μm.

According to the configuration described above, the effect of relaxing the electric field concentration is enhanced in the first electric field relaxing region. The breakdown voltage of the silicon carbide semiconductor device can thus be increased.

(7) Preferably, the width (w1) of the first electric field relaxing region (2) along the peripheral direction (X) is not less than 15 μm and not more than 50 μm.

According to the configuration described above, the effect of relaxing the electric field concentration is further enhanced in the first electric field relaxing region. The breakdown voltage of the silicon carbide semiconductor device can thus be increased.

(8) Preferably, a dose amount of an impurity contained in the first electric field relaxing region (2) is within a range of not less than $1\times10^{13}$ cm$^{-2}$ and not more than $2\times10^{13}$ cm$^{-2}$.

According to the configuration described above, the effect of relaxing the electric field concentration is further enhanced in the first electric field relaxing region. The breakdown voltage of the silicon carbide semiconductor device can thus be increased.

(9) Preferably, the dose amount of the impurity contained in the first electric field relaxing region (2) is within a range of not less than $1.65\times10^{13}$ cm$^{-2}$ and not more than $2\times10^{13}$ cm$^{-2}$.

According to the configuration described above, the electric field concentration can be relaxed and a sufficient voltage drop can be generated in the first electric field relaxing region. Thus, a silicon carbide semiconductor device having improved ruggedness can be provided.

(10) Preferably, an impurity concentration in the first electric field relaxing region (2) varies in stages along the peripheral direction (X).

According to the configuration described above, the electric field concentration in the first electric field relaxing region can be relaxed more effectively. The breakdown voltage of the silicon carbide semiconductor device can thus be increased.

(11) Preferably, the second electric field relaxing region (3) includes a plurality of regions (3a to 3i) disposed at a distance from each other. The extension portion (65a) is disposed on the insulating film (15b, 70) so as to overlie at least a portion of a first region (3a) closest to the first electric field relaxing region (2) of the plurality of regions (3a to 3i).

According to the configuration described above, the effect of relaxing the electric field concentration is enhanced by the first electric field relaxing region and the second electric field relaxing region. Thus, the breakdown voltage of the silicon carbide semiconductor device can be increased.

(12) Preferably, at least one of widths (w2 to w10) of the plurality of regions (3a to 3i) and impurity concentrations in the plurality of regions (3a to 3i) along the peripheral direction (X) varies in stages between the plurality of regions (3a to 3i).

According to the configuration described above, the effect of relaxing the electric field concentration is further enhanced. The breakdown voltage of the silicon carbide semiconductor device can thus be increased.

(13) Preferably, the semiconductor element portion (7) includes a transistor element. The transistor element includes a body region (13). The body region (13) has the second conductivity type, is disposed in the silicon carbide layer (10), and is electrically connected to the first electric field relaxing region (2). An impurity concentration in the first electric field relaxing region (2) is lower than an impurity concentration in the body region (13).

According to the configuration described above, since the impurity concentration in the first electric field relaxing region (2) is lower than the impurity concentration in the body region (13), a depletion layer is more likely to extend in the first electric field relaxing region than in the body region. Thus, the electric field concentration can be relaxed in the first electric field relaxing region. In addition, the electrode can be disposed so as to span the boundary between the body region and the first electric field relaxing region. Consequently, the electric field concentration in the body region can also be relaxed.

(14) Preferably, the electrode includes a Schottky electrode (66) in Schottky contact with the silicon carbide layer (10).

According to the configuration described above, if the silicon carbide semiconductor device is a Schottky barrier diode, the breakdown voltage of the Schottky barrier diode can be increased.

(15) Preferably, the semiconductor element portion (7) includes a second conductivity type impurity region (19). The second conductivity type impurity region (19) is disposed in the silicon carbide layer (10), has the second conductivity type, and forms a diode together with the silicon carbide layer (10). The electrode includes a diode electrode (67) electrically connected to the second conductivity type impurity region (19). An impurity concentration in the first electric field relaxing region (2) is lower than an impurity concentration in the second conductivity type impurity region (19).

According to the configuration described above, if the silicon carbide semiconductor device is a PN junction diode, the breakdown voltage of the PN junction diode can be increased.

DETAILS OF EMBODIMENTS OF THE INVENTION

Embodiments of the present invention will be described below with reference to the drawings. In the following drawings, the same or corresponding parts are designated by the same reference numbers and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "–" thereabove, a negative sign herein precedes a number to indicate a crystallographically negative index. Angles are described using a system having an omni-directional angle of 360 degrees.

First Embodiment

Figure 2:
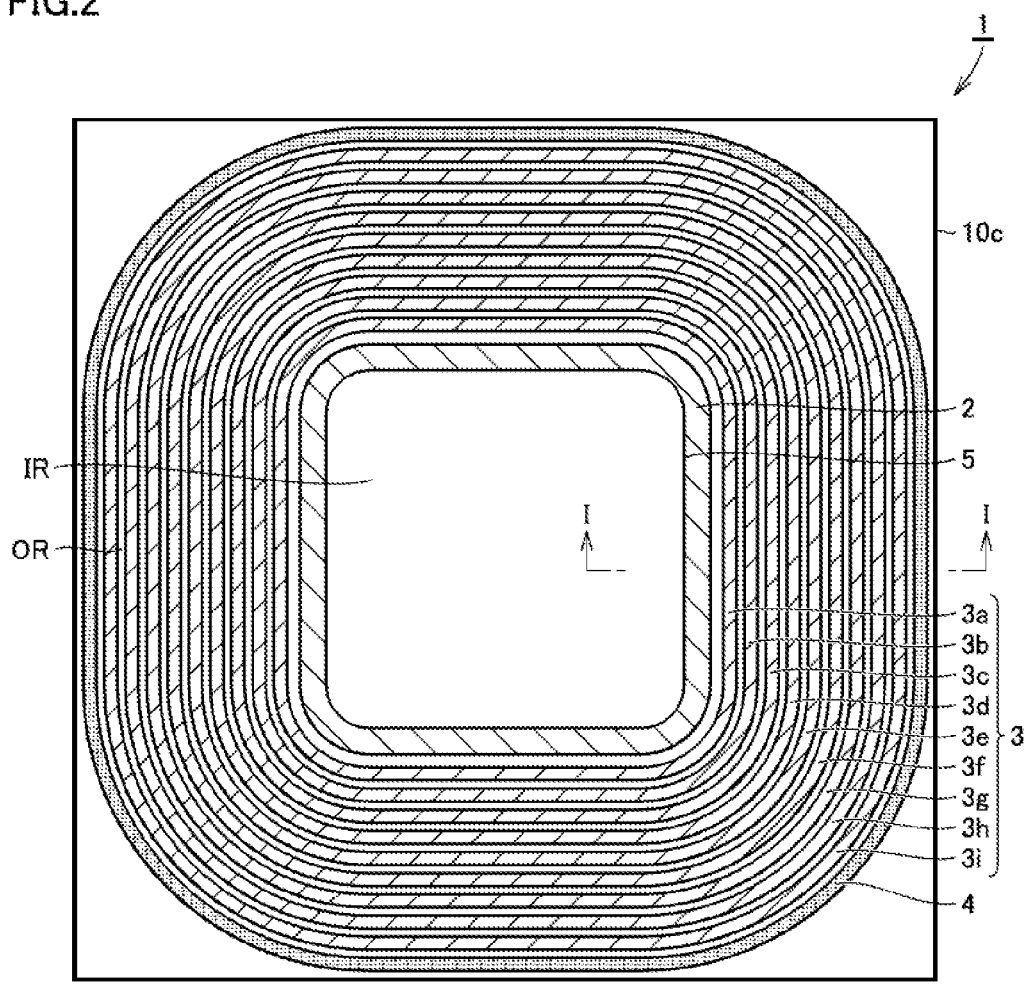
FIG. 2 is a schematic plan view schematically showing the structure of a JTE (Junction Termination Extension) region and a guard ring region of a silicon carbide semiconductor device according to one embodiment of the present invention.

FIG. 1 is a schematic sectional view schematically showing the structure of a silicon carbide semiconductor device according to a first embodiment of the present invention. FIG. 2 is a schematic plan view schematically showing the structure of a JTE (Junction Termination Extension) region and a guard ring region of a silicon carbide semiconductor device according to one embodiment of the present invention.

Referring to FIGS. 1 and 2, the configuration of a MOSFET (Metal Oxide Semiconductor Field Effect Transistor) is described first as the silicon carbide semiconductor device according to one embodiment of the present invention.

Referring to FIGS. 1 and 2, a silicon carbide semiconductor device 1 includes an element region IR and a termination region OR. Termination region OR is disposed outside element region IR and surrounds element region IR. Termination region OR is a region for relaxing electric field concentration in silicon carbide semiconductor device 1.

A detailed configuration of silicon carbide semiconductor device 1 is now described. Silicon carbide semiconductor device 1 includes a silicon carbide layer 10, an insulating film 15, a gate electrode 27, a source electrode 16, a drain electrode 20, an insulating film 70, an interlayer insulating film 71, a pad electrode 65, and a backside protection electrode 50.

Silicon carbide layer 10 is made of hexagonal silicon carbide of polytype 4H, for example, and includes a first main surface 10a and a second main surface 10b. Second main surface 10b is located opposite first main surface 10a. Silicon carbide layer 10 has n type conductivity (first conductivity type).

Silicon carbide layer 10 includes an n$^+$ substrate 11 and a drift layer 12. N$^+$ substrate 11 is made of hexagonal silicon carbide of polytype 4H, for example. N$^+$ substrate 11 contains a high concentration of impurity (donor) such as N (nitrogen). N$^+$ substrate 11 has an impurity concentration of approximately $1.0 \times 10^{18}$ cm$^{-3}$, for example.

Drift layer 12 is an epitaxial layer made of hexagonal silicon carbide of polytype 4H, for example. Drift layer 12 has a thickness of not less than approximately 5 μm and not more than approximately 35 μm, for example. The term "thickness" or "depth" means a length in a direction perpendicular to first main surface 10a of silicon carbide layer 10.

An impurity concentration in drift layer 12 is lower than the impurity concentration in n$^+$ substrate 11. Drift layer 12 has an impurity concentration of not less than approximately $1.0 \times 10^{15}$ cm$^{-3}$ and not more than approximately $1.0 \times 10^{16}$ cm$^{-3}$, for example. Drift layer 12 contains an impurity such as nitrogen.

Silicon carbide layer 10 includes two layers in this embodiment. However, silicon carbide layer 10 may be implemented as a single layer. Alternatively, silicon carbide layer 10 may include three or more layers.

Element region IR includes a semiconductor element portion 7 formed in silicon carbide layer 10. More specifically, element region IR includes body regions 13, source regions 14, and p$^+$ regions 18. Termination region OR includes a JTE region 2, a guard ring region 3, and a field stop region 4. Body regions 13, source regions 14, p$^+$ regions 18, JTE region 2, guard ring region 3, and field stop region 4 are disposed in silicon carbide layer 10.

JTE region 2 is a first electric field relaxing region for relaxing electric field concentration in silicon carbide semiconductor device 1. As shown in FIG. 2, when viewed two-dimensionally, JTE region 2 is disposed outside body region 13, and disposed in silicon carbide layer 10 so as to surround body region 13. The term "viewed two-dimensionally" means a view seen from first main surface 10a of silicon carbide layer 10.

JTE region 2 is in contact with body region 13. A boundary 5 between JTE region 2 and body region 13 corresponds to a boundary between element region IR and termination region OR.

JTE region 2 has a second conductivity type different from the first conductivity type. JTE region 2 has p type conductivity in this embodiment. JTE region 2 contains an impurity (acceptor) such as Al (aluminum) or B (boron). A dose amount of the impurity contained in JTE region 2 is not less than $1 \times 10^{13}$ cm$^{-2}$. Preferably, the dose amount of the impurity contained in JTE region 2 is within a range of not less than $1 \times 10^{13}$ cm$^{-2}$ and not more than $2 \times 10^{13}$ cm$^{-2}$. The dose amount can be determined by, for example, integrating the p type impurity concentration in JTE region 2 along a depth direction of JTE region 2.

A direction X shown in FIG. 1 represents a direction from a central portion (element region IR) of first main surface 10a of silicon carbide layer 10 toward a peripheral portion (termination region OR) of first main surface 10a. Direction X is herein also referred to as a "peripheral direction."

A length along the peripheral direction, that is, a length along direction X, is herein referred to as a "width." In the first embodiment, a width w1 of JTE region 2 is not less than 5 μm, preferably not less than 15 μm and not more than 50 μm. The thickness of JTE region 2 with reference to first main surface 10a is not less than approximately 0.3 μm and not more than approximately 0.8 μm, for example.

Guard ring region 3 is a second electric field relaxing region for relaxing electric field concentration in silicon carbide semiconductor device 1. Specifically, guard ring region 3 is a p type region containing an impurity such as aluminum or boron. A dose amount of the impurity contained in guard ring region 3 is not less than $1 \times 10^{13}$ cm$^{-2}$, for example. The dose amount of the impurity contained in guard ring region 3 may be substantially equal to the dose amount of the impurity contained in JTE region 2 (for example, within a range of ±5% with reference to the dose amount of the impurity contained in JTE region 2).

The electric field concentration in silicon carbide semiconductor device 1 can be relaxed by JTE region 2 as well as guard ring region 3. Thus, a breakdown voltage of silicon carbide semiconductor device 1 can be further increased. For this reason, it is preferable to provide guard ring region 3 in silicon carbide semiconductor device 1. If a breakdown voltage required of silicon carbide semiconductor device 1 can be achieved by JTE region 2, however, guard ring region 3 may not be provided in silicon carbide semiconductor device 1 according to the embodiment of the present invention.

Guard ring region 3 may include a plurality of guard ring portions 3a to 3i. As shown in FIG. 2, when viewed two-dimensionally, the plurality of guard ring portions 3a to 3i each have an annular shape, and are disposed at a distance from one another. In one embodiment, there are nine guard ring portions. However, the number of guard ring portions is not particularly limited. Further, in the configuration shown in FIG. 1, each guard ring portion is in contact with first main surface 10a of silicon carbide layer 10. However, each guard ring portion may be disposed in silicon carbide layer 10 (drift layer 12) at a distance from first main surface 10a of silicon carbide layer 10.

Field stop region 4 is disposed outside guard ring region 3 and surrounds guard ring region 3 when viewed two-dimensionally. The "outside" corresponds to the side of an end 10c of silicon carbide layer 10. Field stop region 4 is provided separately from guard ring region 3. Field stop region 4 has n type conductivity. An impurity concentration in field stop region 4 is higher than the impurity concentration in drift layer 12. Field stop region 4 contains an impurity such as P (phosphorus).

Body region 13 is a p type region. Body region 13 contains an impurity (acceptor) such as aluminum or boron. In one embodiment, body region 13 is disposed in silicon carbide layer 10 so as to be in contact with first main surface 10a of silicon carbide layer 10.

An impurity concentration in body region 13 is higher than the impurity concentration in JTE region 2. In other words, the impurity concentration in JTE region 2 is lower than the impurity concentration in body region 13. The impurity concentration in body region 13 in the vicinity of first main surface 10a is not less than approximately $1 \times 10^{16}$ cm$^{-3}$ and not more than approximately $5 \times 10^{17}$ cm$^{-3}$, for example. The impurity concentration in a deep portion of body region 13 is approximately $1 \times 10^{18}$ cm$^{-3}$, for example. The thickness of body region 13 with reference to first main surface 10a of silicon carbide layer 10 is not less than approximately 0.5 μm and not more than approximately 1.0 μm, for example.

Source region 14 is an n type region. Source region 14 is disposed in body region 13 and is in contact with first main surface 10a of silicon carbide layer 10. Source region 14 is separated from drift layer 12 by body region 13.

Source region 14 contains an impurity such as P (phosphorus). An impurity concentration in source region 14 is higher than the impurity concentration in drift layer 12. Source region 14 has an impurity concentration of not less than approximately $1 \times 10^{19}$ cm$^{-3}$ and not more than approximately $1 \times 10^{20}$ cm$^{-3}$ for example.

P$^+$ region 18 (contact region) is a p type region and contains an impurity such as aluminum or boron. P$^+$ region 18 is disposed in body region 13 and is in contact with first main surface 10a of silicon carbide layer 10. As shown in FIG. 1, p$^+$ region 18 may be in contact with source region 14. An impurity concentration in p$^+$ region 18 is higher than the impurity concentration in body region 13. P$^+$ region 18 has an impurity concentration of not less than approximately $2 \times 10^{19}$ cm$^{-3}$ and not more than approximately $5 \times 10^{29}$ cm$^{-3}$, for example.

Insulating film 15 includes a gate insulating film 15a and an insulating film 15b. In this embodiment, insulating film 15 (gate insulating film 15a and insulating film 15b) is a silicon dioxide film, for example, a thermal oxidation film. The thickness of gate insulating film 15a and insulating film 15b with reference to first main surface 10a is approximately 50 nm, for example.

Gate insulating film 15a is provided on first main surface 10a of silicon carbide layer 10, in a position facing channel regions CH formed in body regions 13. Gate insulating film 15a is in contact with body regions 13, source regions 14 and drift layer 12 so as to extend from an upper surface of one of source regions 14 to an upper surface of the other source region 14. Insulating film 15b is disposed on first main surface 10a of silicon carbide layer 10 so as to be in contact with JTE region 2.

Gate electrode 27 is disposed on gate insulating film 15a. Gate electrode 27 extends from above one of source regions 14 to above the other source region 14 to face a portion of drift layer 12 lying between these two source regions, and two channel regions CH. Gate electrode 27 is made of a conductor such as polysilicon including an impurity, or aluminum.

Source electrode 16 is in contact with and electrically connected to source region 14 and p$^+$ region 18. Preferably, source electrode 16 is in ohmic contact with source region 14 and p$^+$ region 18. In one embodiment, source electrode 16 is made of a material including nickel and silicon. Source electrode 16 may be made of a material including titanium, aluminum and silicon.

Insulating film 70 is disposed in contact with insulating film 15b. Interlayer insulating film 71 is disposed on gate insulating film 15a to cover gate electrode 27. Each of insulating film 70 and interlayer insulating film 71 is a silicon dioxide film, for example. A deposited oxide film, for example, is applied to each of insulating film 70 and interlayer insulating film 71.

A sum of the thickness of insulating film 70 and the thickness of insulating film 15b may be not less than approximately 0.05 μm and not more than approximately 2.0 μm, for example. Accordingly, insulating film 70 may be omitted from the configuration shown in FIG. 1. Alternatively, an additional insulating film (for example, a silicon nitride film) may be provided on insulating film 70.

Drain electrode 20 is in contact with second main surface 10b of silicon carbide layer 10 and electrically connected to n+ substrate 11. Drain electrode 20 may have a configuration similar to that of source electrode 16 described above, for example. Alternatively, drain electrode 20 may be made of another material capable of making ohmic contact with n+ substrate 11, such as nickel.

Backside protection electrode 50 is in contact with drain electrode 20. Backside protection electrode 50 is thus electrically connected to drain electrode 20. Backside protection electrode 50 is made of titanium, nickel, silver, or an alloy thereof, for example.

Pad electrode 65 overlies insulating film 70 and interlayer insulating film 71 and is in contact with source electrode 16. Pad electrode 65 is thus electrically connected to source region 14 and p+ region 18 with source electrode 16 interposed therebetween. Pad electrode 65 may be made of aluminum, for example.

Pad electrode 65 includes an extension portion 65a. Extension portion 65a is disposed on insulating film 70 so as to overlie at least a portion of JTE region 2. Extension portion 65a extends from an end of JTE region 2 close to element region IR, namely, from boundary 5. In other words, pad electrode 65 is partially disposed on the insulating film (insulating film 70 and insulating film 15b) so as to span the boundary between JTE region 2 and body region 13.

During use of silicon carbide semiconductor device 1, the voltage of silicon carbide layer 10 may become higher than the voltage of body region 13. In this case, a depletion layer extends from a junction surface between silicon carbide layer 10 and body region 13. JTE region 2 is electrically connected to body region 13 by being in contact with body region 13. Accordingly, a depletion layer also extends from a junction surface between silicon carbide layer 10 and JTE region 2.

Electric field concentration can be relaxed by the depletion layer extending from the junction surface between silicon carbide layer 10 and JTE region 2. Moreover, extension portion 65a overlies JTE region 2 with insulating films 15b and 70 interposed therebetween.

Extension portion 65a is a portion of pad electrode 65. Pad electrode 65 is electrically connected to body region 13 with source electrode 16 interposed therebetween. Further, JTE region 2 is electrically connected to body region 13. Thus, a voltage applied to JTE region 2 is substantially equal to a voltage of extension portion 65a. The effect of relaxing the electric field concentration by JTE region 2 is further enhanced by the voltage of extension portion 65a. The breakdown voltage of silicon carbide semiconductor device 1 can thus be increased.

A width w11 of extension portion 65a is defined as the length of extension portion 65a in direction X (peripheral direction) with reference to the end of JTE region 2 close to body region 13. The end of JTE region 2 close to body region 13 corresponds to boundary 5 described above.

Width w11 has a value suitable for enhancing the effect of relaxing the electric field concentration. When width w11 is less than 5 μm, the effect of relaxing the electric field concentration by extension portion 65a is reduced. Width w11 is thus preferably not less than 5 μm.

Width w1 of JTE region 2 is not less than 5 μm in this embodiment. When width w1 of JTE region 2 is less than 5 μm, the effect of relaxing the electric field concentration may not be exercised sufficiently, for example. Alternatively, upon occurrence of avalanche breakdown at a junction surface between JTE region 2 and drift layer 12, a current may not be controlled sufficiently in JTE region 2, which may result in inability to achieve a required avalanche resistance.

By setting width w1 to not less than 5 μm, the effect of relaxing the electric field concentration is enhanced. Moreover, upon occurrence of avalanche breakdown at the junction surface between JTE region 2 and drift layer 12, a reverse current flows through JTE region 2 into body region 13. By setting JTE region 2 to not less than 5 μm, a sufficient voltage drop can be generated in JTE region 2. In other words, JTE region 2 can function as a current limiting resistor, thereby increasing the avalanche resistance.

Preferably, width w1 of JTE region 2 is not less than 15 μm and not more than 50 μm. When width w1 of JTE region 2 is more than 50 μm, the effect of relaxing the electric field concentration can be exercised sufficiently in JTE region 2. However, the size of silicon carbide semiconductor device 1 increases. In order to sufficiently increase the breakdown voltage of silicon carbide semiconductor device 1 while minimizing the increase in size of silicon carbide semiconductor device 1, width w1 of JTE region 2 is preferably not less than 15 μm and not more than 50 μm.

The dose amount of the impurity contained in JTE region 2 is preferably within the range of not less than $1 \times 10^{13}$ cm$^{-2}$ and not more than $2 \times 10^{13}$ cm$^{-2}$. When the dose amount of the impurity contained in JTE region 2 is less than $1 \times 10^{13}$ cm$^{-2}$, it is believed that the electric field in JTE region 2 will be more likely to be affected by a voltage supplied to extension portion 65a. It is thus believed, for example, that the breakdown voltage of silicon carbide semiconductor device 1 will not be sufficiently increased.

When the dose amount of the impurity in JTE region 2 is more than $2 \times 10^{13}$ cm$^{-2}$, on the other hand, the effect of relaxing the electric field concentration by JTE region 2 tends to be reduced. It is believed that the breakdown voltage of silicon carbide semiconductor device 1 will not be sufficiently increased even if the effect of relaxing the electric field concentration is increased by extension portion 65a, for example. In order to relax the electric field concentration by both extension portion 65a and JTE region 2, the dose amount of the impurity in JTE region 2 is preferably within the range of not less than $1 \times 10^{13}$ cm$^{-2}$ and not more than $2 \times 10^{13}$ cm$^{-2}$.

More preferably, the dose amount of the impurity contained in JTE region 2 is within a range of not less than $1.65 \times 10^{13}$ cm$^{-2}$ and not more than $2 \times 10^{13}$ cm$^{-2}$. By setting the dose amount of the impurity within the range of not less than $1.65 \times 10^{13}$ cm$^{-2}$ and not more than $2 \times 10^{13}$ cm$^{-2}$, the breakdown voltage of the silicon carbide semiconductor device can be increased, and variation in the breakdown voltage of the silicon carbide semiconductor device relative to variation in the dose amount can be reduced.

In guard ring region 3, each of widths w2 to w10 between nine guard ring portions 3a to 3i is 5 µm, for example. A distance d1 between JTE region 2 and guard ring region 3 is not less than approximately 2 µm and not more than approximately 5 µm, for example. A distance d2 between two adjacent guard ring portions is not less than approximately 2 µm and not more than approximately 5 µm, for example. A width wt from the end of JTE region 2 (the boundary between JTE region 2 and body region 13) to the end of the outermost guard ring portion (guard ring portion 3i in the configuration shown in FIG. 2) is not less than approximately 20 µm and not more than approximately 200 µm, for example.

Figure 3:
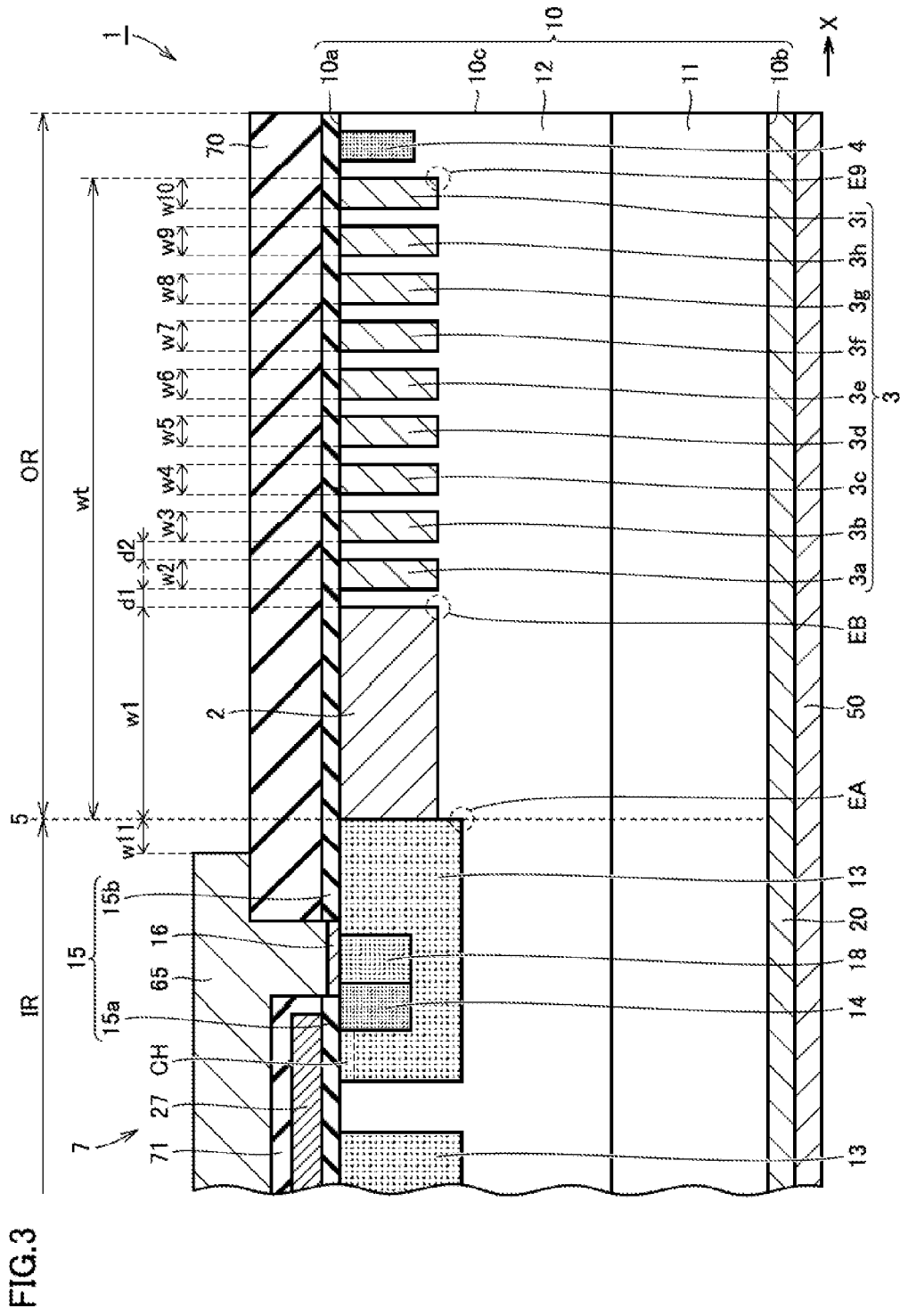
FIG. 3 shows the silicon carbide semiconductor device according to the embodiment of the present invention having a modified electrode structure.

The effect of relaxing the electric field concentration by extension portion 65a is further described in detail. FIG. 3 shows silicon carbide semiconductor device 1 according to the embodiment of the present invention having a modified electrode structure. Referring to FIG. 3, pad electrode 65 does not include an extension portion overlying JTE region 2. Width w11 is shown in FIG. 3 in order to compare the configuration shown in FIG. 3 with the configuration shown in FIG. 1. Width w11 can be considered to be a negative value in the configuration shown in FIG. 3.

Figure 4:
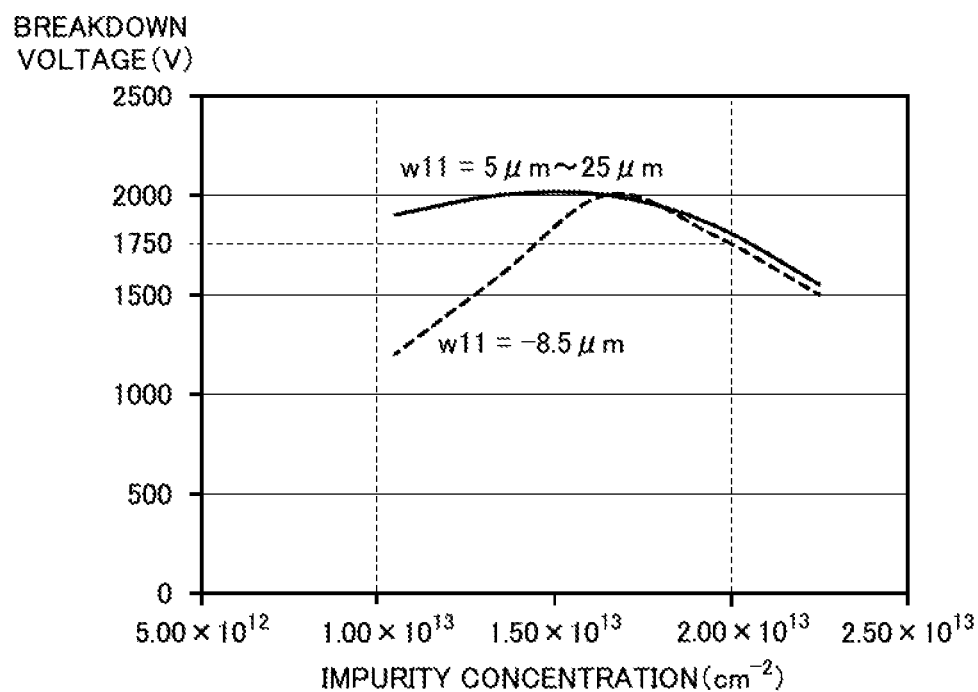
FIG. 4 illustrates relation between an impurity concentration (dose amount) in the JTE region and a breakdown voltage of the silicon carbide semiconductor device, which is obtained by the structures shown in FIGS. 1 and 3.

FIG. 4 illustrates relation between the impurity concentration (dose amount) in JTE region 2 and the breakdown voltage of the silicon carbide semiconductor device, which is obtained by the structures shown in FIGS. 1 and 3. Referring to FIG. 4, in the case of width w11=−8.5 µm (the configuration of FIG. 3), the breakdown voltage of the silicon carbide semiconductor device varies between approximately 1200 V and approximately 2000 V relative to the impurity concentration (dose amount) within a range of not less than $1.0 \times 10^{13}$ $cm^{-2}$ and not more than $2.0 \times 10^{13}$ $cm^{-2}$. In contrast, in the case of width w11=5 µm to 25 µm (the configuration of FIG. 1), the breakdown voltage of the silicon carbide semiconductor device varies within a range between approximately 1750 V and approximately 2000 V relative to the impurity concentration (dose amount) within the range of not less than $1.0 \times 10^{13}$ $cm^{-2}$ and not more than $2.0 \times 10^{13}$ $cm^{-2}$. As shown in FIG. 4, in silicon carbide semiconductor device 1 according to the first embodiment of the present invention, the effect of variation in the impurity concentration (dose amount) in JTE region 2 on the breakdown voltage of silicon carbide semiconductor device 1 can be reduced by extension portion 65a.

Figure 5:
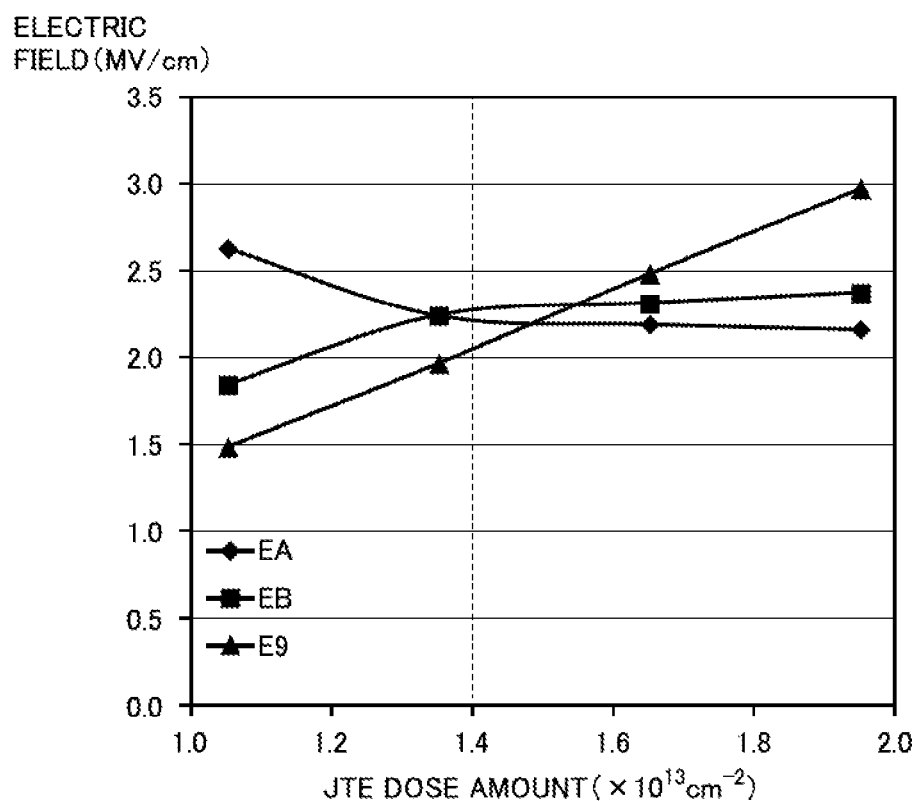
FIG. 5 illustrates relation between the dose amount in the JTE region and electric field strength in the silicon carbide semiconductor device shown in FIG. 3.

FIG. 5 illustrates relation between the dose amount in JTE region 2 and electric field strength in the silicon carbide semiconductor device shown in FIG. 3. Referring to FIGS. 3 and 5, an electric field EA is an electric field at an end (in contact with JTE region 2) of body region 13 in contact with JTE region 2. An electric field EB is an electric field at an end of JTE region 2 (opposite body region 13). An electric field E9 is an electric field at an end of guard ring portion 3i. Electric field EA is higher than electric field EB and electric field E9 when the dose amount in JTE region 2 is within a range of not less than $1.0 \times 10^{13}$ $cm^{-2}$ and not more than $1.4 \times 10^{13}$ $cm^{-2}$.

Since body region 13 has a high impurity concentration, electric field concentration tends to occur at the end of body region 13 when the dose amount in JTE region 2 is low. In the configuration shown in FIG. 3, pad electrode 65 does not include an extension portion that contributes to relaxing the electric field concentration. It is thus believed that the breakdown voltage is more likely to be reduced by the electric field concentration at the end of body region 13.

As shown in FIGS. 4 and 5, in order to increase the breakdown voltage of the silicon carbide semiconductor device under the condition of W11≤0, it is required to control the dose amount in JTE region 2 within a suitable range with accuracy. However, the dose amount varies during the manufacture of silicon carbide semiconductor device 1. It is thus difficult to constantly achieve an optimal dose amount in JTE region 2 during the manufacture of silicon carbide semiconductor device 1.

According to the first embodiment of the present invention, however, variation in the breakdown voltage of silicon carbide semiconductor device 1 can be reduced by extension portion 65a of pad electrode 65 even if the dose amount in JTE region 2 varies, thus allowing for high-yield manufacturing of silicon carbide semiconductor devices having a high breakdown voltage. Electric field concentration tends to occur at the end of body region 13 (the end in the vicinity of boundary 5) particularly when the dose amount in JTE region 2 is low. However, with extension portion 65a, pad electrode 65 is disposed on insulating film 70 so as to span boundary 5. Consequently, the electric field concentration at the end of body region 13 can be relaxed. Accordingly, the breakdown voltage of the silicon carbide semiconductor device can be increased even when the dose amount in JTE region 2 is low.

From the relation between the magnitude of the electric fields and the dose amount in JTE region 2 shown in FIG. 5, as the dose amount in JTE region 2 increases, the position where the electric field concentration tends to occur (having high electric field strength) moves away from body region 13 toward end 10c of silicon carbide layer 10. The higher the electric field strength, the more likely the avalanche breakdown occurs. Accordingly, as the dose amount in JTE region 2 increases, the position where the avalanche breakdown occurs moves toward termination region OR.

When an avalanche breakdown occurs in termination region OR, a reverse current flows through JTE region 2 into body region 13. The impurity concentration in JTE region 2 is lower than the impurity concentration in body region 13. Thus, JTE region 2 can function as a resistor. The reverse current flowing through this resistor is limited. Further, a large voltage drop can be generated by this resistor According to the first embodiment, therefore, the avalanche resistance can be increased.

In order to cause the occurrence of avalanche breakdown in termination region OR, width w1 of JTE region 2 is preferably not less than 5 µm. More preferably, width w1 of JTE region 2 is not less than 15 µm and not more than 50 µm.

Figure 6:
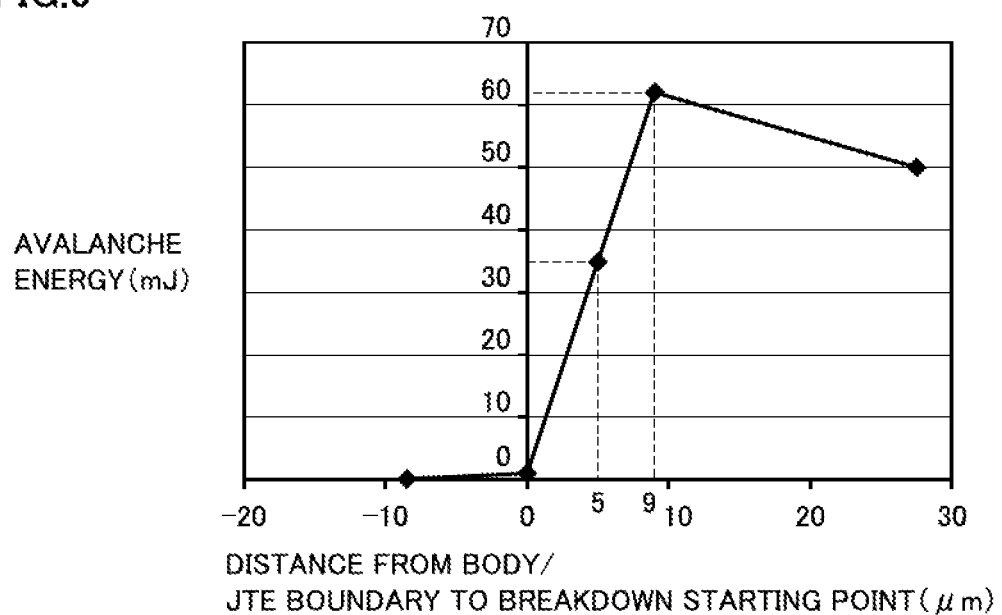
FIG. 6 illustrates an example of relation between a distance from a boundary between a body region and the JTE region to a breakdown starting point, and avalanche energy.

FIG. 6 illustrates an example of relation between the distance from boundary 5 between body region 13 and JTE region 2 to a breakdown starting point, and avalanche energy. The "breakdown starting point" means a position where the avalanche breakdown occurs. The dose amount in JTE region 2 has a value within the range of not less than $1.0 \times 10^{13}$ $cm^{-2}$ and not more than $2.0 \times 10^{13}$ $cm^{-2}$.

Referring to FIG. 6, the horizontal axis of the graph indicates the distance from boundary 5 between body region 13 and JTE region 2 in a direction toward termination region OR (end 10c of silicon carbide layer 10). When the distance from boundary 5 between body region 13 and JTE region 2 is within a range from 0 µm to 9 µm, the avalanche energy increases with increase in this distance. In a position where the distance from boundary 5 is 5 µm, the avalanche energy is approximately 30 (mJ). It can be considered that the ruggedness of silicon carbide semiconductor device 1 has reached a practical level if the avalanche energy is approximately 30 (mJ). In a position where the distance from boundary 5 between body region 13 and JTE region 2 is 9 µm, the avalanche energy is approximately 60 (mJ).

As extension portion 65a extends longer in direction X (direction from element region IR toward termination region OR), the distance from the boundary between body region 13 and JTE region 2 to the breakdown starting point can be increased. Consequently, the ruggedness of the silicon carbide semiconductor device can be improved.

By setting width w11 of extension portion 65a to not less than 5 µm, the breakdown starting point can be positioned not less than 5 µm from boundary 5, thus allowing silicon carbide semiconductor device 1 to have ruggedness at a practical level. More preferably, width w11 of extension portion 65a is not less than 9 µm. In this case, the breakdown starting point can be positioned not less than 9 µm from boundary 5, thus allowing silicon carbide semiconductor device 1 to have further improved ruggedness.

Second Embodiment

Figure 7:
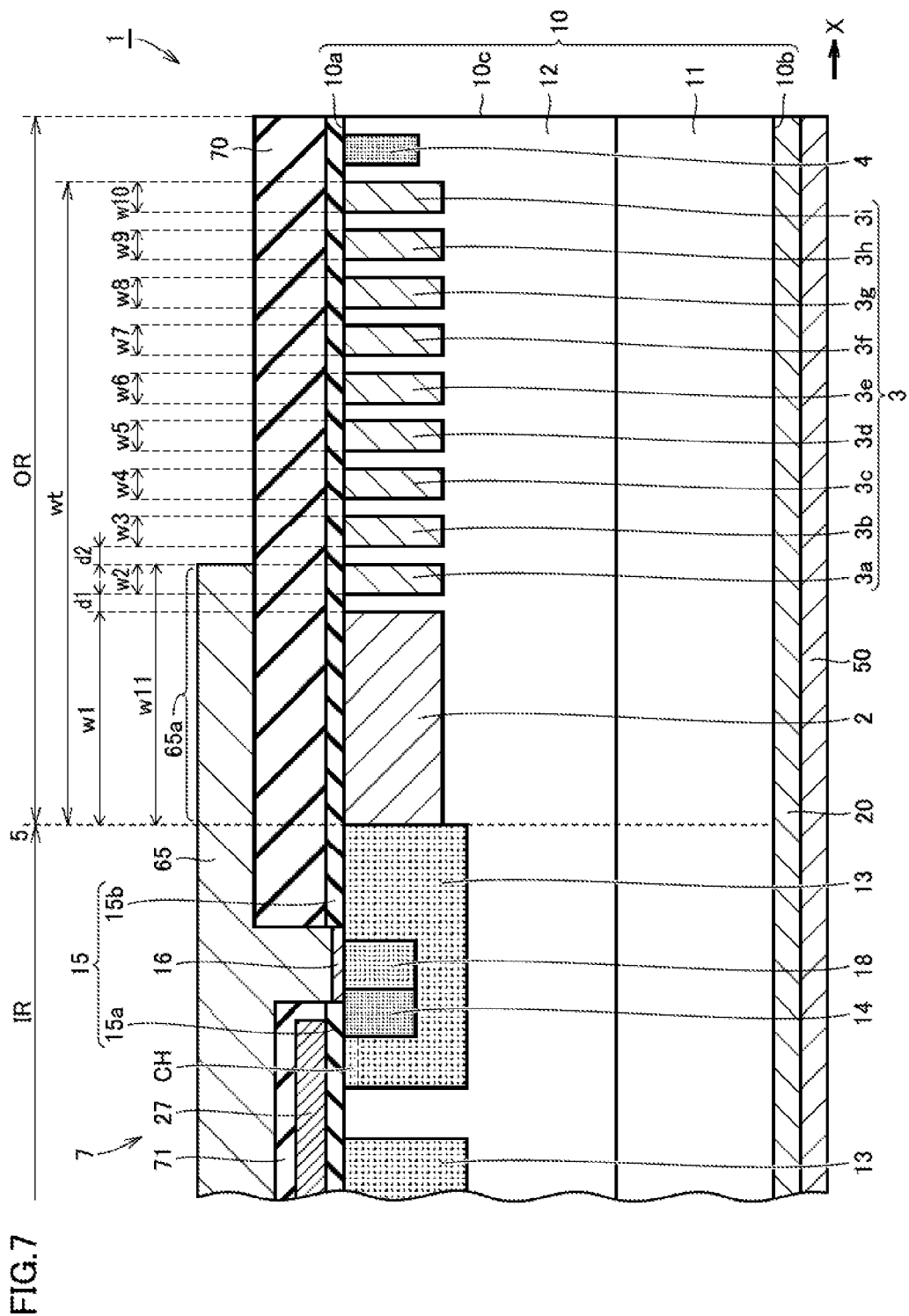
FIG. 7 is a schematic sectional view schematically showing a silicon carbide semiconductor device according to a second embodiment of the present invention.

FIG. 7 is a schematic sectional view schematically showing a silicon carbide semiconductor device according to a second embodiment of the present invention. Referring to FIG. 7, extension portion 65a is disposed on insulating film 70, and extends from the end (boundary 5) of JTE region 2 so as to overlie JTE region 2 and at least a portion of guard ring region 3.

Extension portion 65a is disposed on insulating film 70 so as to overlie guard ring portion 3a. Guard ring portion 3a corresponds to a portion closest to JTE region 2 of the plurality of guard ring portions.

Extension portion 65a may overlie the entire guard ring portion 3a. Alternatively, extension portion 65a may overlie a portion of guard ring portion 3a. As long as extending along direction X, extension portion 65a may overlie other guard ring portions (for example, guard ring portion 3b) in addition to guard ring portion 3a.

The conditions such as width w1 of JTE region 2, the dose amount in JTE region 2, and the dose amount in guard ring region 3 can be the same as those in the first embodiment, and thus detailed description of these conditions will not be repeated.

According to the second embodiment, the electric field concentration in guard ring portion 3a can be relaxed by extension portion 65a. According to the second embodiment, therefore, the breakdown voltage of the silicon carbide semiconductor device can be increased as in the first embodiment.

Third Embodiment

Figure 8:
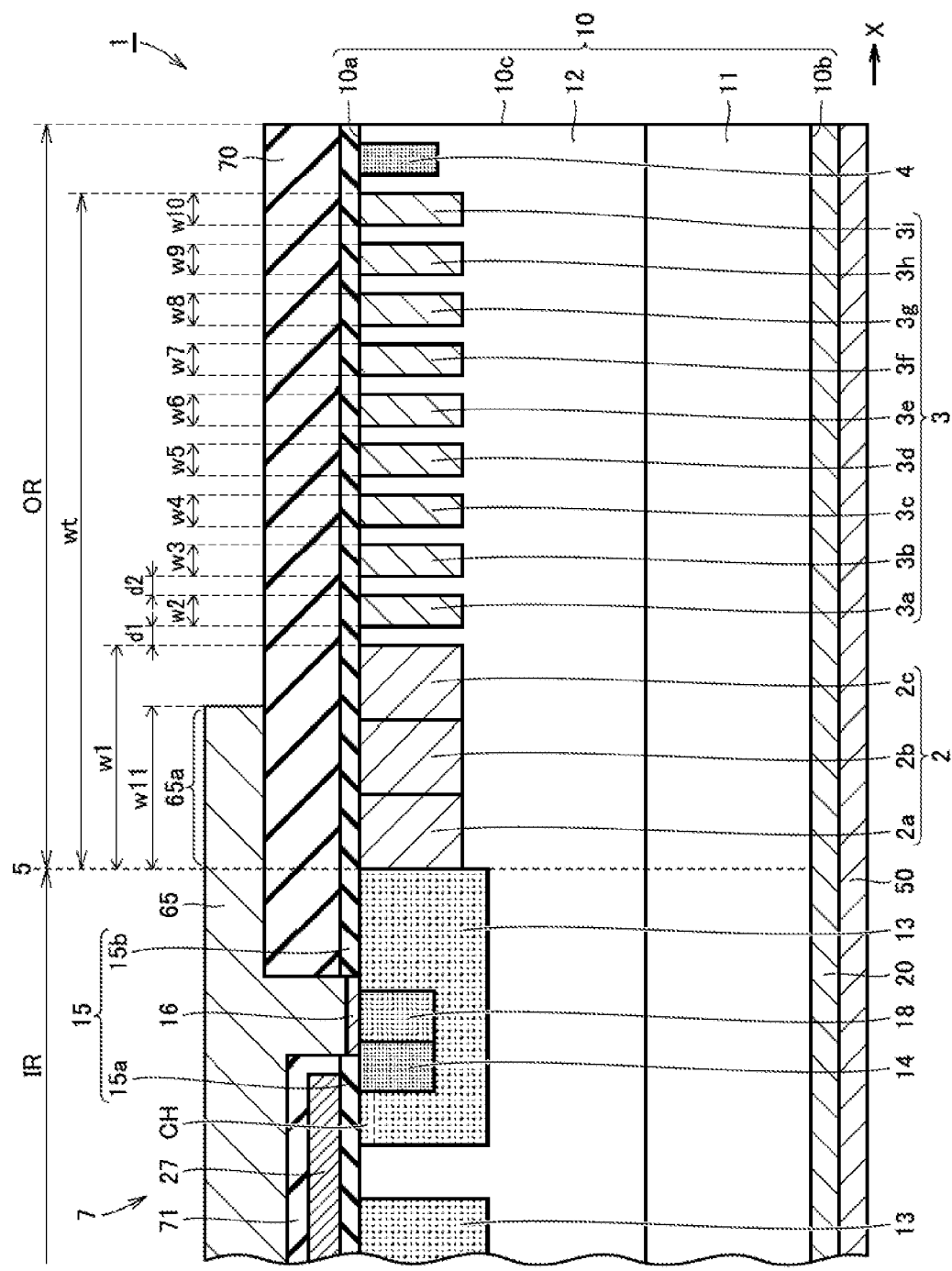
FIG. 8 is a schematic sectional view schematically showing a silicon carbide semiconductor device according to a third embodiment of the present invention.

FIG. 8 is a schematic sectional view schematically showing a silicon carbide semiconductor device according to a third embodiment of the present invention. Referring to FIG. 8, JTE region 2 includes three regions 2a, 2b and 2c.

In one embodiment, the impurity concentration varies in stages among regions 2a, 2b and 2c. For example, region 2a may have the highest impurity concentration, region 2c may have the lowest impurity concentration, and region 2b may have an impurity concentration in between them.

In addition to the impurity concentrations, the width in direction X may vary in stages among regions 2a. 2b and 2c. Regarding the widths, for example, region 2a may have the greatest width, region 2c may have the smallest width, and region 2b may have a width in between them. Conversely, region 2a may have the smallest width, region 2c may have the greatest width, and region 2b may have a width in between them.

Extension portion 65a is only required to overlie at least a portion of region 2a. Thus, as shown in FIG. 8, extension portion 65a may overlie both regions 2a and 2b. Alternatively, extension portion 65a may overlie only region 2a. Alternatively, extension portion 65a may overlie all of regions 2a, 2b and 2c.

Moreover, as in the second embodiment, extension portion 65a may overlie not only JTE region 2 but also at least a portion of guard ring region 3.

The conditions such as width w1 of JTE region 2, the dose amount in JTE region 2, and the dose amount in guard ring region 3 can be the same as those in the first embodiment. The impurity concentrations (dose amounts) in regions 2a, 2b and 2c can be appropriately selected within the range of not less than $1.0 \times 10^{13}$ cm$^{-2}$ and not more than $2.0 \times 10^{13}$ cm$^{-2}$.

According to the third embodiment, distribution of the impurity concentration in JTE region 2 can be adjusted to thereby further enhance the effect of relaxing the electric field concentration by JTE region 2. According to the third embodiment, therefore, the breakdown voltage of the silicon carbide semiconductor device can be increased.

Fourth Embodiment

A silicon carbide semiconductor device according to a fourth embodiment of the present invention is similar in cross section to the schematic sectional view of FIG. 1, for example. Accordingly, the silicon carbide semiconductor device according to the fourth embodiment is described with reference to FIG. 1.

In the fourth embodiment, guard ring region 3 includes the plurality of guard ring portions 3a to 3i formed such that at least one of the widths and the impurity concentrations varies in stages. For example, guard ring portions 3a to 3i may be formed such that the impurity concentrations decrease with increase in distance from JTE region 2 (from boundary 5 toward end 10c of silicon carbide layer 10). Alternatively, guard ring portions 3a to 3i may be formed such that the widths decrease with increase in distance from JTE region 2.

The conditions such as width w1 of JTE region 2 and the dose amount in JTE region 2 can be the same as those in the first embodiment. For example, the dose amounts in guard ring portions 3a to 3i can be appropriately selected within the range of not less than $1.0 \times 10^{13}$ cm$^{-2}$ and not more than $2.0 \times 10^{13}$ cm$^{-2}$.

According to the fourth embodiment, the effect of relaxing the electric field concentration is further enhanced by the plurality of guard ring portions 3a to 3i. The breakdown voltage of the silicon carbide semiconductor device can thus be increased.

Fifth Embodiment

According to the first to fourth embodiments, semiconductor element portion 7 includes a vertical type MOSFET. However, semiconductor element portion 7 may include a diode.

Figure 9:
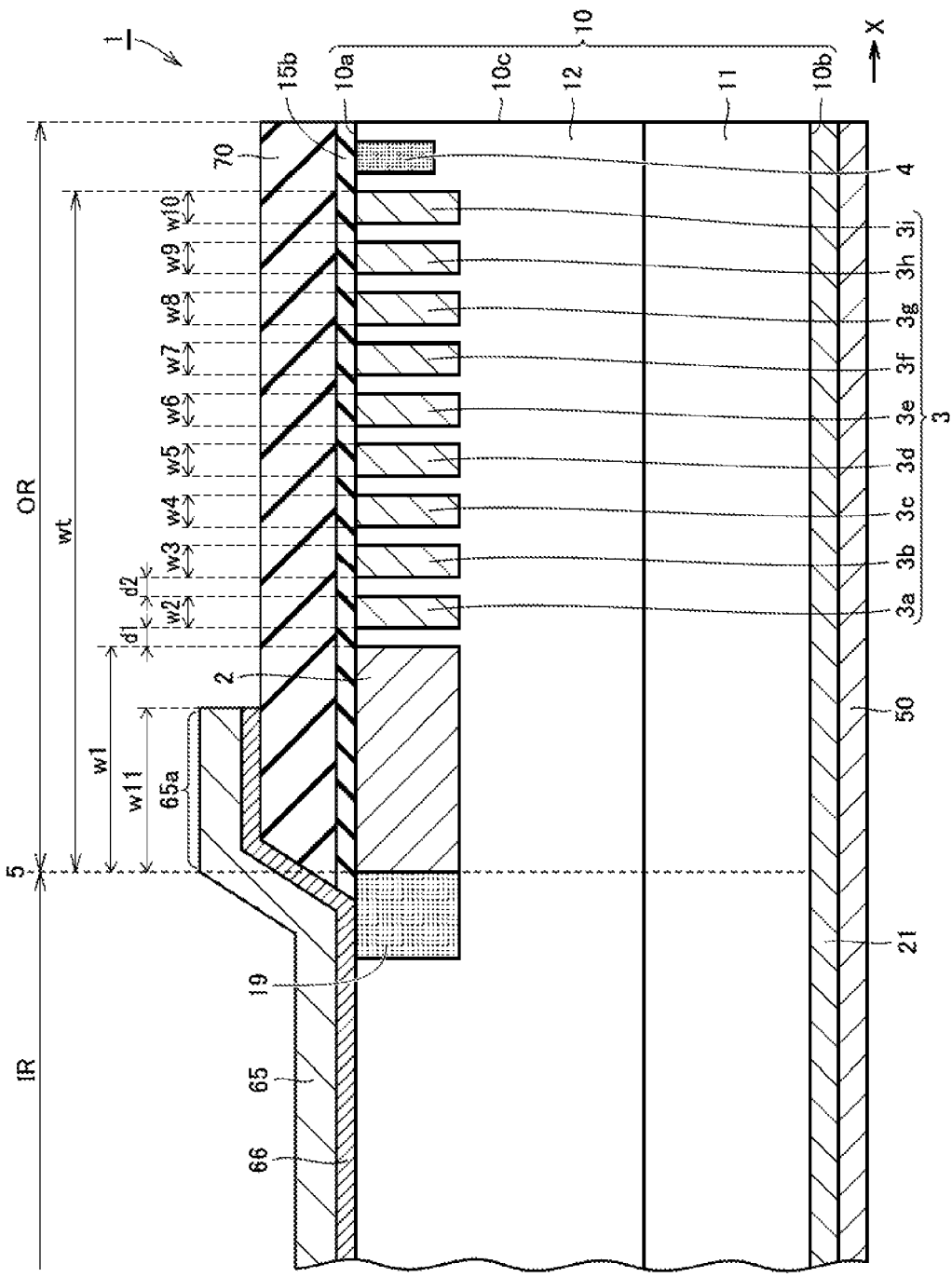
FIG. 9 is a schematic sectional view schematically showing a silicon carbide semiconductor device according to a fifth embodiment of the present invention.

FIG. 9 is a schematic sectional view schematically showing a silicon carbide semiconductor device according to a fifth embodiment of the present invention. Referring to FIG. 9, semiconductor element portion 7 includes a Schottky barrier diode (SBD). Specifically, semiconductor element portion 7 includes a Schottky electrode 66 and a p type region 19. Drain electrode 20 is replaced by an ohmic electrode 21 in ohmic contact with n$^+$ substrate 11.

P type region 19 is disposed in silicon carbide layer 10 (more specifically, drift layer 12) so as to be in contact with first main surface 10a of silicon carbide layer 10. Schottky electrode 66 is in Schottky contact with silicon carbide layer 10 (drift layer 12). Schottky electrode 66 is also electrically connected to p type region 19. Schottky electrode 66 is made of titanium (Ti), for example Schottky electrode 66 may be made of nickel (Ni), titanium nitride (TiN), gold (Au), molybdenum (Mo), tungsten (W) and the like, for example, other than titanium. That is. Schottky electrode 66 may include at least one element selected from the group consisting of titanium, molybdenum, nickel, gold and tungsten.

Pad electrode 65 is disposed on and electrically connected to Schottky electrode 66. Pad electrode 65 includes extension portion 65a.

As with the silicon carbide semiconductor devices according to the first to fourth embodiments, extension portion 65a of pad electrode 65 overlies JTE region 2 with insulating film 15b and insulating film 70 interposed therebetween. A portion of Schottky electrode 66 may also overlie JTE region 2 with insulating film 15b and insulating film 70 interposed therebetween.

The width of the portion of Schottky electrode 66 overlying JTE region 2 may be equal to or different from width w11 of extension portion 65a Moreover, as in the second embodiment, extension portion 65a may overlie JTE region 2 and guard ring portion 3a with insulating films 15b and 70 interposed therebetween.

The conditions such as width w1 of JTE region 2, the dose amount in JTE region 2, and the dose amounts in guard ring portions 3a to 3i can be the same as those in the first embodiment. Alternatively, as in the third embodiment, JTE region 2 may include a plurality of regions having widths or impurity concentrations that vary in stages in the fifth embodiment. Alternatively, as in the fourth embodiment, guard ring region 3 may include the plurality of guard ring portions 3a to 3i formed such that the widths or impurity concentrations vary in stages in the fifth embodiment.

According to the fifth embodiment, if the silicon carbide semiconductor device is a Schottky barrier diode, the breakdown voltage of the diode can be increased.

Sixth Embodiment

FIG. 10 is a schematic sectional view schematically showing a silicon carbide semiconductor device according to a sixth embodiment of the present invention. Referring to FIG. 10, semiconductor element portion 7 includes a PN junction diode. Specifically, semiconductor element portion 7 includes a contact electrode 67 and p type region 19.

P type region 19 is a second conductivity type impurity region containing an impurity (acceptor) such as aluminum or boron. P type region 19 is disposed in silicon carbide layer 10 (more specifically, drift layer 12) so as to be in contact with first main surface 10a of silicon carbide layer 10. P type region 19 and drift layer 12 form a PN junction.

Contact electrode 67 is electrically connected to p type region 19. Contact electrode 67 is preferably in ohmic contact with p type region 19.

As with the silicon carbide semiconductor devices according to the first to fourth embodiments, extension portion 65a of pad electrode 65 overlies JTE region 2 with insulating film 15b and insulating film 70 interposed therebetween. Width w11 of extension portion 65a in direction X can be determined in the same manner as that for the silicon carbide semiconductor device according to any one of the first to fourth embodiments.

The conditions such as width w1 of JTE region 2, the dose amount in JTE region 2, and the dose amounts in guard ring portions 3a to 3i can be the same as those in the first embodiment. Alternatively, as in the third embodiment, JTE region 2 may include a plurality of regions having widths or impurity concentrations that vary in stages in the sixth embodiment. Alternatively, as in the fourth embodiment, guard ring region 3 may include the plurality of guard ring portions 3a to 3i formed such that the widths or impurity concentrations vary in stages in the sixth embodiment.

According to the sixth embodiment, if the silicon carbide semiconductor device is a PN junction diode, the breakdown voltage of the diode can be increased.

As shown in FIG. 2, JTE region 2 surrounds element region IR Extension portion 65a overlies at least a portion of JTE region 2. Thus, extension portion 65a may be disposed so as to surround element region IR when viewed two-dimensionally. Alternatively, extension portion 65a may overlie only a portion of JTE region 2 when viewed two-dimensionally. For example, extension portion 65a may overlie only a corner portion of JTE region 2 when viewed two-dimensionally.

The silicon carbide semiconductor devices according to the first to fourth embodiments include a planar gate type MOSFET in the semiconductor element portion. However, the structure of the MOSFET is not limited to the planar gate type. The semiconductor element portion may include a trench gate type MOSFET.

The trench may include a predetermined crystal plane at a portion over body region 13. The "predetermined crystal plane" may be a plane including a first plane having a plane orientation of {0-33-8}. The predetermined crystal plane may microscopically include the first plane, and further microscopically include a second plane having a plane orientation of {0-11-1}. More preferably, the first plane and the second plane may include a combined plane having a plane orientation of {0-11-2}. The "predetermined crystal plane" can also be defined as a plane macroscopically having an off angle of 62°±10° relative to a {000-1}plane. The term "macroscopically" means disregarding a fine structure having a size of approximately interatomic spacing. For the measurement of such a macroscopic off angle, a method employing general X-ray diffraction can be used, for example.

Further, in the embodiments where the semiconductor element portion includes a transistor, the transistor is not limited to a MOSFET. The transistor included in the semiconductor element portion may be an IGBT (Insulated Gate Bipolar Transistor). Moreover, the transistor is not limited to include a gate electrode and a gate insulating film. Thus, the transistor included in the semiconductor element may be a bipolar junction transistor.

Further, in the embodiments described above, the silicon carbide layer has n type conductivity (first conductivity type), while body region 13, JTE region 21 and guard ring region 3 have p type conductivity (second conductivity type). By forming the p type regions in the n type silicon carbide layer, the manufacturability of the silicon carbide semiconductor device can be improved. However, the first conductivity type may be p type and the second conductivity type may be n type.

Although the embodiments of the present invention have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A silicon carbide semiconductor device comprising:
  a silicon carbide layer including a first main surface and a second main surface located opposite said first main surface, said silicon carbide layer having a first conductivity type;
  an element region including a semiconductor element portion formed in said silicon carbide layer;
  a first electric field relaxing region having a second conductivity type different from said first conductivity type, said first electric field relaxing region being disposed in said silicon carbide layer so as to be in contact with said first main surface of said silicon carbide layer and so as to surround said element region when viewed two-dimensionally;

an insulating film disposed on said first main surface and covering said first electric field relaxing region; and an electrode electrically connected to said first electric field relaxing region, said electrode including an extension portion extending from an end of said first electric field relaxing region close to said element region in a peripheral direction from said element region toward said first electric field relaxing region, said extension portion being disposed on said insulating film, said extension portion overlying at least a portion of said first electric field relaxing region.

2. The silicon carbide semiconductor device according to claim 1, further comprising a second electric field relaxing region disposed in said silicon carbide layer so as to surround said first electric field relaxing region when viewed two-dimensionally, said second electric field relaxing region having said second conductivity type.

3. The silicon carbide semiconductor device according to claim 2, wherein said insulating film is disposed on said first main surface of said silicon carbide layer so as to cover said first electric field relaxing region and said second electric field relaxing region, and said extension portion of said electrode extends from said end of said first electric field relaxing region so as to overlie said first electric field relaxing region and at least a portion of said second electric field relaxing region.

4. The silicon carbide semiconductor device according to claim 1, wherein a width of said extension portion from said end of said first electric field relaxing region along said peripheral direction is not less than 5 μm.

5. The silicon carbide semiconductor device according to claim 4, wherein said width of said extension portion from said end of said first electric field relaxing region along said peripheral direction is not less than 9 μm.

6. The silicon carbide semiconductor device according to claim 1, wherein a width of said first electric field relaxing region along said peripheral direction is not less than 5 μm.

7. The silicon carbide semiconductor device according to claim 6, wherein said width of said first electric field relaxing region along said peripheral direction is not less than 15 μm and not more than 50 μm.

8. The silicon carbide semiconductor device according to claim 1, wherein a dose amount of an impurity contained in said first electric field relaxing region is within a range of not less than $1 \times 10^{13}$ cm$^{-2}$ and not more than $2 \times 10^{13}$ cm$^{-2}$.

9. The silicon carbide semiconductor device according to claim 8, wherein said dose amount of said impurity contained in said first electric field relaxing region is within a range of not less than $1.65 \times 10^{13}$ cm$^{-2}$ and not more than $2 \times 10^{13}$ cm$^{-2}$.

10. The silicon carbide semiconductor device according to claim 1, wherein an impurity concentration in said first electric field relaxing region varies in stages along said peripheral direction.

11. The silicon carbide semiconductor device according to claim 2, wherein said second electric field relaxing region includes a plurality of regions disposed at a distance from each other, and said extension portion is disposed on said insulating film so as to overlie at least a portion of a first region closest to said first electric field relaxing region of said plurality of regions.

12. The silicon carbide semiconductor device according to claim 11, wherein at least one of widths of said plurality of regions and impurity concentrations in said plurality of regions along said peripheral direction varies in stages between said plurality of regions.

13. The silicon carbide semiconductor device according to claim 1, wherein said semiconductor element portion includes a transistor element, said transistor element including a body region, said body region having said second conductivity type, being disposed in said silicon carbide layer, and being electrically connected to said first electric field relaxing region, and an impurity concentration in said first electric field relaxing region is lower than an impurity concentration in said body region.

14. The silicon carbide semiconductor device according to claim 1, wherein said electrode includes a Schottky electrode in Schottky contact with said silicon carbide layer.

15. The silicon carbide semiconductor device according to claim 1, wherein said semiconductor element portion includes a second conductivity type impurity region, said second conductivity type impurity region being disposed in said silicon carbide layer, having said second conductivity type, and forming a diode together with said silicon carbide layer, said electrode includes a diode electrode electrically connected to said second conductivity type impurity region, and an impurity concentration in said first electric field relaxing region is lower than an impurity concentration in said second conductivity type impurity region.

* * * * *